(12) United States Patent
Waki et al.

(10) Patent No.: US 8,691,366 B2
(45) Date of Patent: Apr. 8, 2014

(54) CUTTING TOOL

(75) Inventors: Masahiro Waki, Satsumasendai (JP); Yaocan Zhu, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/700,408

(22) PCT Filed: May 27, 2011

(86) PCT No.: PCT/JP2011/062242
§ 371 (c)(1),
(2), (4) Date: Nov. 27, 2012

(87) PCT Pub. No.: WO2011/149064
PCT Pub. Date: Dec. 1, 2011

(65) Prior Publication Data
US 2013/0071620 A1 Mar. 21, 2013

(30) Foreign Application Priority Data

May 27, 2010 (JP) .................. 2010-121715

(51) Int. Cl.
*B23B 27/14* (2006.01)

(52) U.S. Cl.
CPC ..................................... *B23B 27/14* (2013.01)
USPC ............ 428/148; 428/102; 428/195.1; 407/11

(58) Field of Classification Search
CPC ........... C01F 7/002; C01F 7/66; C01G 23/00; C01G 30/00; C01G 33/006; B23D 17/00; B23D 27/10; B23D 27/14
USPC ......... 428/102, 103, 141, 142, 143, 144, 148, 428/195.1
See application file for complete search history.

(56) References Cited

U.S. PATENT DOCUMENTS

| | | | |
|---|---|---|---|
| 7,056,602 B2 * | 6/2006 | Horling et al. | 428/697 |
| 2002/0176753 A1 | 11/2002 | Kato | |
| 2009/0317659 A1 | 12/2009 | Yamamoto | |
| 2011/0239835 A1 * | 10/2011 | Aiso et al. | 83/22 |
| 2013/0022419 A1 * | 1/2013 | Sakamoto et al. | 407/115 |

FOREIGN PATENT DOCUMENTS

| | | |
|---|---|---|
| JP | 11-302831 | 11/1999 |
| JP | 2002-346812 | 12/2002 |
| JP | 2005-199420 | 7/2005 |
| JP | 2008-264975 | 11/2008 |
| JP | 2010-1547 | 1/2010 |
| JP | 2010-111952 | 5/2010 |

* cited by examiner

*Primary Examiner* — Aaron Austin
*Assistant Examiner* — Megha Mehta
(74) *Attorney, Agent, or Firm* — Schlee IP International, P.C.; Alexander R. Schlee

(57) ABSTRACT

A cutting tool with a substrate which is coated with a coating layer containing $Ti_aAl_bNb_dM_e(C_{1-x}N_x)$, where M represents one or more elements selected from among Si, W, Mo, Ta, Hf, Cr, Zr and Y, where $0.1 \leq a \leq 0.7$, $0 \leq b \leq 0.8$, $0.02 \leq d \leq 0.25$, $0 \leq e \leq 25$, $a+b+d+e=1.0$ and $0 \leq x \leq 1$ and is provided with a rake face; a flank face; a cutting edge between the rake face and the flank face; and droplets on the surface of the coating layer. The droplets include finer droplets having particle diameters of 300 nm or less; and coarser droplets having particle diameters of 1000 nm or more. The flank face has a higher percentage of the finer droplets than the rake face. An Nb content in the coarser droplets on the flank face is higher than an Nb of the coarser droplets on the rake face.

4 Claims, 2 Drawing Sheets

CUTTING TOOL

CROSS-REFERENCE TO RELATED APPLICATIONS

This application is a national phase of the International Patent Application PCT/JP2011/062242 filed on May 27, 2011 that claims the priority from Japanese patent applications 2010-121715 filed on May 27, 2010. The content of these aforementioned documents is herewith incorporated by reference in its entirety.

TECHNICAL FIELD OF THE INVENTION

The present invention relates to a cutting tool consisting of a substrate the surface of which is coated with a coating layer.

BACKGROUND OF THE INVENTION

Nowadays, in the field of a member such as a cutting tool, an abrasion resistant member and a slide member of which abrasion resistance, slide performance and fracture resistance are required, there is a method for improving abrasion resistance, slide performance and fracture resistance by forming a coating layer on the surface of a substrate which is made of a sintered alloy such as cemented carbide and cermet, a high hardness sintered body such as diamond and cBN (cubic boron nitride) or ceramics such as alumina or silicon nitride.

In addition, investigations are being actively conducted on a method for forming a nitride layer which mainly consists of Ti or Al as a coating layer described above, by using a physical vapor deposition method such as arc ion plating and sputtering, and on improvements for prolonging a tool life. There have been various kinds of improvements in addition to the chemical elements for the coating layer of the tools the surfaces of which are coated in order to cope with changes in the environment of cutting operation including an increase in cutting speed and with the diversification of materials to be cut.

For example, Japanese Patent Application Publication No. 2008-264975 discloses a tool consisting of a substrate the surface of which is coated with a film of such as TiAlN, a Ti content being larger on the flank face of the tool than on the rake face.

In addition, Japanese Patent Application Publication No. 2002-346812 discloses a TiAlN base hard film having a thickness of 1 μm or more and 5 μm or less with which the surface of a substitute is coated, the fraction of coarse particles having a diameter of the film thickness or more existing in the hard film being 5 area % or less, and the roughness Ra of the surface of the film being 0.1 μm or less or the roughness Rz of the surface of the film being 1 μm or less.

Moreover, Japanese Patent Application Publication No. 11-302831 discloses a hard film of (TiNbAl)N and so forth with which the surface of a substrate is coated, and Japanese Patent Application Publication No. 2005-199420 discloses a hard film, the film containing (TiAlNbSi)N and so forth and consisting of a multilayer consisting of layers having different contents of Si and Nb due to different methods for forming films.

The following is a list of the aforementioned background art:
PTL 1: Japanese Unexamined Patent Application Publication No. 2008-264975
PTL 2: Japanese Unexamined Patent Application Publication No. 2002-346812
PTL 3: Japanese Unexamined Patent Application Publication No. 11-302831
PTL 4: Japanese Unexamined Patent Application Publication No. 2005-199420

However, even with the contexture according to Japanese Patent Application Publication No. 2008-264975 in which a Ti content is larger on the flank face than on the rake face, the heat resistance and the oxidation resistance of a coating layer are insufficient on the rake face and fracture resistance is insufficient on the flank face.

In addition, in the case of the contexture according to Japanese Patent Application Publication No. 2002-346812 in which the fraction of coarse particles is decreased as much as possible, there is an increase in the temperature of the hard film due to entire abutting of chips to the hard film caused by the small roughness of the surface, which results in progression of crater wear and in there being a problem of a decrease in abrasion resistance.

Moreover, even with a composition containing Nb as the third metal in addition to TiAlN according to Patent Literatures 3 and 4, although abrasion resistance is increased, more increase is needed, and, in particular, there are cases where abrasion rapidly progresses due to chipping, fracture or an increase in temperature caused by welding of a workpiece and so forth. Therefore, further increase in abrasion resistance is desired.

An object of the present invention is to solve the problems described above and to provide a cutting tool composing of a coating layer which can locally show an ideal cutting performance.

SUMMARY OF THE INVENTION

The cutting tool according to the present invention consists of a substrate which is coated with a coating layer containing $Ti_aAl_bNb_dM_e(C_{1-x}N_x)$, where M represents one or more elements selected from among Si, W, Mo, Ta, Hf, Cr, Zr and Y, where $0.1 \leq a \leq 0.7$, $0.1 \leq b \leq 0.8$, $0.02 \leq d \leq 0.25$, $0 \leq e \leq 0.25$, $a+b+d+e=1$ and $0 \leq x \leq 0.1$, a rake face, a flank face and a cutting edge between the rake face and the flank face, droplets existing on the surface of the coating layer, there being a larger amount of finer droplets having particle diameters of 300 nm or less on the flank face than on the rake face and a Nb content in an average composition of coarser droplets having particle diameters of 1000 nm or more on the flank face being larger than that on the rake face.

DETAILED DESCRIPTION OF THE INVENTION

As the cutting tool according to the present invention consists of droplets existing on the surface of a coating layer with which a substrate is coated and there is a larger amount of finer droplets having particle diameters of 300 nm or less on a flank face than on a rake face, a residual stress in the coating layer is decreased and crack propagation is suppressed, which results in an increase in chipping resistance on the flank face. In addition, as a Nb content in an average composition of coarser droplets on a flank face is large, the droplets do not immediately disappear due to deterioration even if the temperature of the surface of a coating layer becomes high when cutting is performed, which results in there being an effect of keeping cutting fluid on the surface of the coating layer. As a result, cutting force is decreased and a rise in temperature is suppressed when cutting is performed, and then it is possible to steadily achieve a smooth machined surface by cutting.

BRIEF DESCRIPTION OF DRAWINGS

FIG. 1 is a schematic diagram illustrating an example of the cutting tool according to the present embodiment as follows:

(a) is a schematic diagram of a perspective view and (b) is the cross-sectional view of (a) along the line x-x.

DETAILED DESCRIPTION OF THE DRAWINGS

The cutting tool according to the present invention will be described hereafter in reference to FIG. 1, which illustrates an example of the ideal embodiments of the cutting tool according to the present invention ((a) a schematic diagram of a perspective view, (b) the cross-sectional view of (a) along the line x-x), and FIG. 2, which shows photomicrographs of a rake face (a) and a flank face (b) taken by using scanning electron microscope (SEM).

Figure 1:
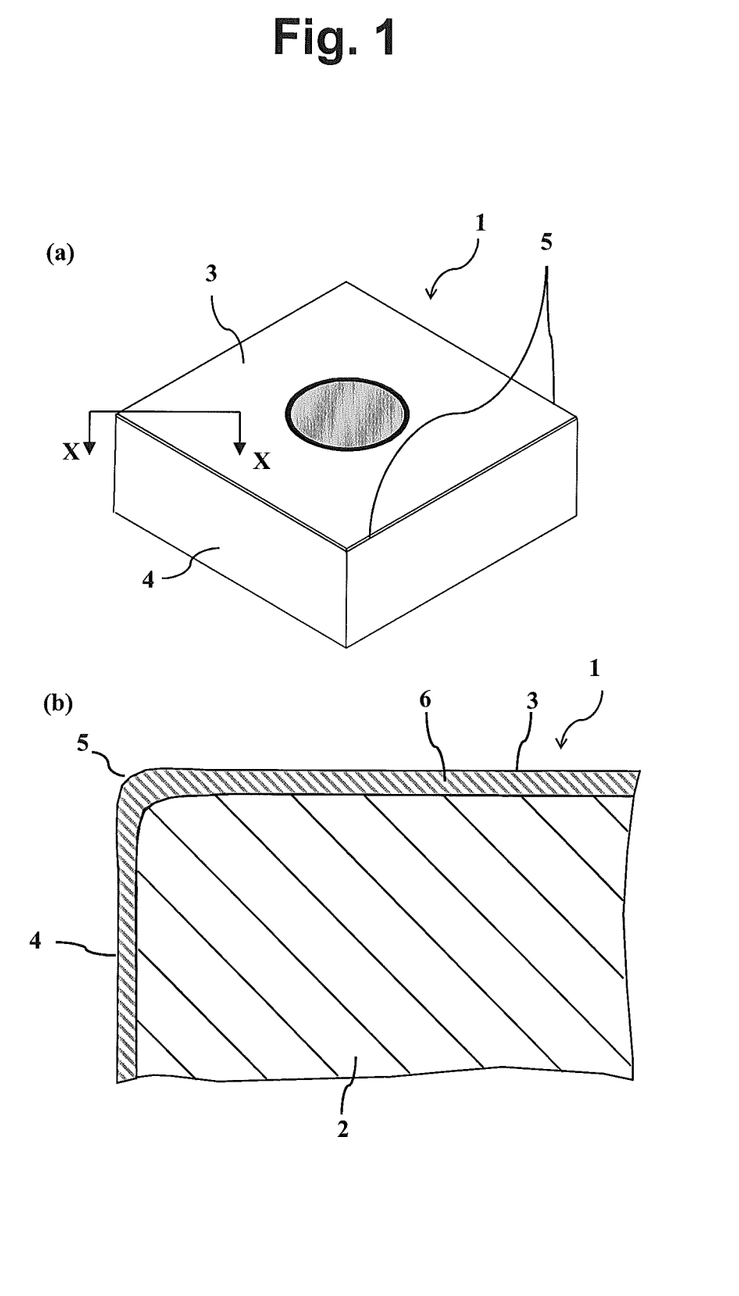
Figure 2:
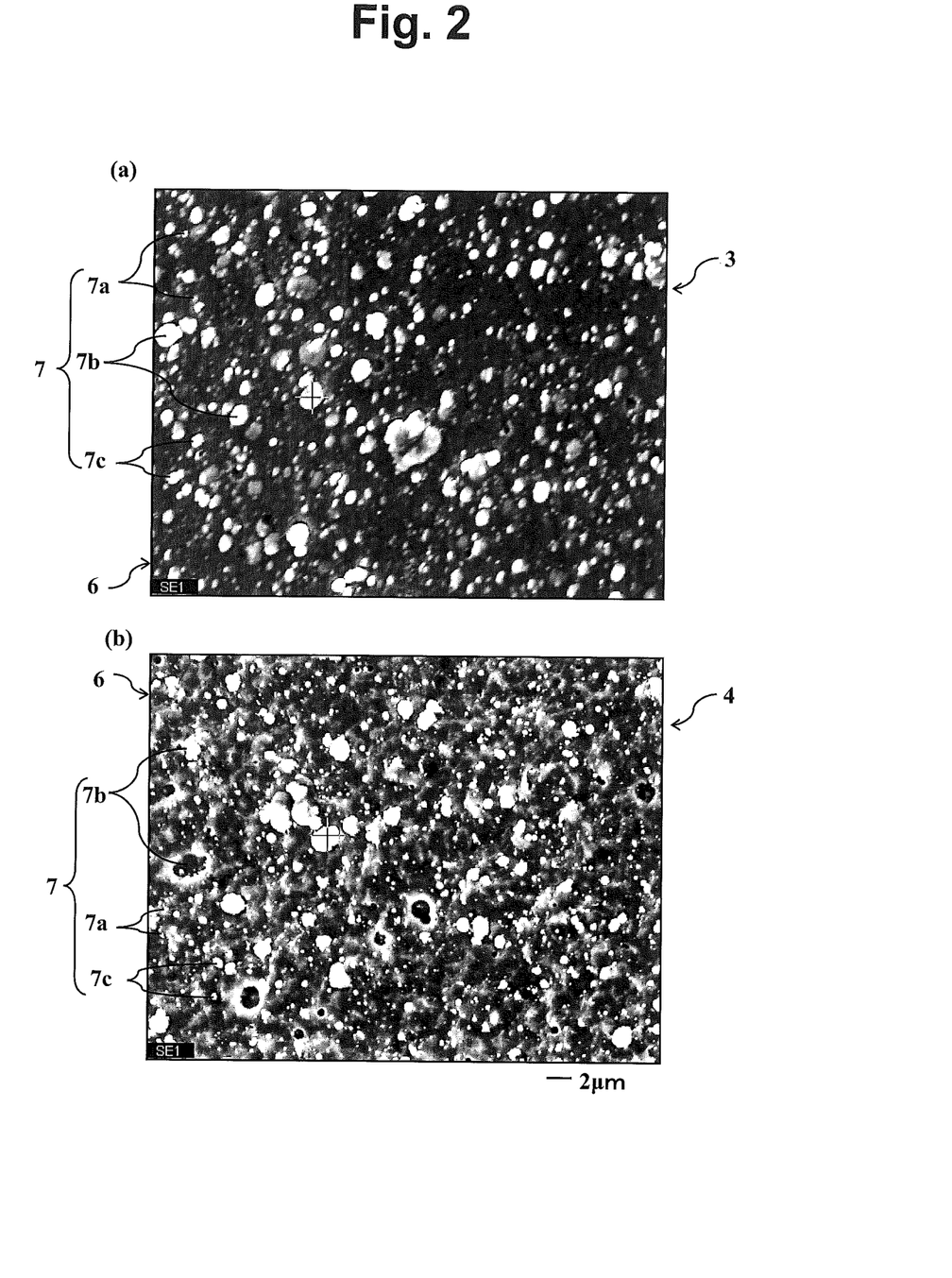
FIG. 2 shows SEM photomicrographs of a rake face (a) and a flank face (b).

As FIG. 1 illustrates, a cutting tool 1 consists of a rake face 3 on the principal plane, flank faces 4 on the side planes, cutting edges 5 between the rake face 3 and the flank faces 4 and a coating layer 6 on the surface of a substrate 2.

The surface of the substrate 2 is coated with the coating layer 6 containing $Ti_aAl_bNb_dM_e(C_{1-x}N_x)$, where M represents one or more elements selected from among Si, W, Mo, Ta, Hf, Cr, Zr and Y, where $0.1 \le a \le 0.7$, $0 \le b \le 0.8$, $0.02 \le d \le 0.025$, $0 \le e \le 0.25$, $a+b+d+e=1$ and $0 \le x \le 1$. Incidentally, as FIG. 2 illustrates, there are particle materials called droplets 7 on the surface of the coating layer 6. In addition, there is a larger amount of finer droplets 7a having particle diameters of 300 nm or less on the flank face 4 than on the rake face 3, and a Nb content in an average composition of coarser droplets 7b having particle diameters of 1000 nm or more on the flank face 4 is larger than that on the rake face 3. It is preferable that the ratio of a Nb content $Nb_{DR}$ of coarser droplets 7b formed on the rake face 3 to a Nb content $Nb_{DF}$ of coarser droplets 7b formed on the flank face 4 be $0.85 \le Nb_{DR}/Nb_{DF} \le 0.96$ in order to optimize the abrasion resistance of the rake face 3 and the flank face 4. The particularly preferable range of the ratio $Nb_{DR}/Nb_{br}$ is $0.86 \le Nb_{DR}/Nb_{DF} \le 0.96$.

By this contexture, a residual stress is decreased and crack propagation is suppressed in the coating layer 6, which results in an increase in chipping resistance on the flank face 4. In addition, as a Nb content of coarser droplets 7b existing in the flank face 4 is large, the droplets do not immediately disappear due to deterioration even if the temperature of the surface of a coating layer 6 becomes high when cutting is performed, which results in there being an effect of keeping cutting fluid on the surface of the coating layer 6. Moreover, as coarser droplets 7b existing on the flank face 4 are of low strength because of the remained metal portion due to insufficient nitridation, the droplets deforms so that the edges of the droplets are broken when cutting is performed and the deterioration of the machined surface can be suppressed. As a result, cutting force is decreased and a rise in temperature is suppressed when cutting is performed, and then it is possible to steadily achieve a smooth machined surface by cutting.

Here, it is preferable that the coarser droplets 7b existing on the flank face 4 have a ratio of a metal content to a non-metal content of greater than 1.2 by atomic ratio and that the ratio increase along distance inward from the surface of the coarser droplets 7b.

In addition, it is preferable that the ratio of the number of intermediate droplets 7c, which is other than the finer droplets 7a and the coarser droplets 7b among the droplets 7, to the total number of the droplets 7 be 30% or more and 70% or less from the viewpoint of the optimization of cutting performance. Incidentally, the metal content in the coating layer can be observed by using electron probe micro analyzer (EPMA) or energy dispersive X-ray spectrometry (EDS).

In addition, it is preferable that the ratio of an Al content $Al_{DR}$ in the coarser droplets 7b existing on the surface of the coating layer 6 on the rake face 3 to an Al content $Al_{DF}$ in the coarser droplets 7b existing on the surface of the coating layer 6 on the flank face 4 be $0.94 \le Al_{DR}/Al_{DF} \le 0.99$ from the viewpoint of the optimization of abrasion resistance on both the rake face 3 and the flank face 4. The particularly preferable range of the ratio $Al_{DR}/Al_{DF}$ is $0.95 \le Al_{DR}/Al_{DF} \le 0.99$. Moreover, it is preferable that the ratio of a Ti content $Ti_{DR}$ in the coarser droplets 7b existing on the surface of the coating layer 6 on the rake face 3 to a Ti content $Ti_{DF}$ in the coarser droplets 7b existing on the surface of the coating layer 6 on the flank face 4 be $1.03 \le Al_{DR}/Al_{DF} \le 1.12$ from the viewpoint of the optimization of abrasion resistance on both the rake face 3 and flank face 4. The particularly preferable range of the ratio $Ti_{DR}/Ti_{DF}$ be $1.05 \le Ti_{DR}/Ti_{DF} \le 1.10$.

Incidentally, the coating layer 6 on the rake face has a composition containing $Ti_aAl_bNb_dM_e(C_{1-x}N_x)$, where M represents one or more elements selected from among Si, W, Mo, Ta, Hf, Cr, Zr and Y, where $0.1 \le a \le 0.7$, $0 \le b \le 0.8$, $0.02 \le d \le 0.25$, $0 \le e \le 0.25$, $a+b+d+e=1$ and $0 \le x \le 1$. By specifying the composition of the coating layer 6 to this range, the oxidation resistance and the internal stress of the coating layer 6 are decreased, because a temperature at which oxidization of the coating layer 6 starts becomes high, which results in an increase in fracture resistance. Moreover, as the coating layer 6 has high hardness and high adhesion to the substrate 2, the coating layer 6 has good abrasion resistance and fracture resistance under intensive cutting conditions such as machining of difficult-to-machine materials, dry cutting and high-speed cutting.

In other words, in the case where a (the composition ratio of Ti) is less than 0.1, there is a decrease in the hardness of the coating layer 6, because the crystal structure of the coating layer 6 changes from cubic to hexagonal, which results a decrease in abrasion resistance. In the case where a (the composition ratio of Ti) is larger than 0.7, there is a decrease in the oxidation resistance and the heat resistance of the coating layer 6. The preferable range of "a" is $0.13 \le a \le 0.55$. In addition, in the case where b (the composition ratio of Al) is larger than 0.8, the crystal structure of the coating layer 6 tends to change from cubic to hexagonal, which results in a decrease in hardness. The preferable range of "b" is $0 \le b \le 0.8$, in particular $0.4 \le b \le 0.7$. In addition, in the case where d (the composition ratio of metal Nb) is less than 0.01, there is a decrease in the oxidation resistance of the coating layer 6, which results in a decrease in abrasion resistance. In the case where d (the composition ratio of metal Nb) is larger than 0.25, there is a decrease in the abrasion resistance of the coating layer 6 due to a decrease in oxidation resistance or hardness. The particularly preferable range of "d" is $0.01 \le d \le 0.10$. Moreover, in the case where e (the composition ratio of metal M) is larger than 0.25, there is a decrease in the abrasion resistance of the coating layer 6 due to a decrease in oxidation resistance or hardness. The preferable range of "e" is $0 < b \le 0.25$, in particular $0.03 \le e \le 0.22$.

Here, M represents one or more elements selected from among Si, W, Mo, Ta, Hf, Cr, Zr and Y, and, in particular, it is preferable that Si or W be contained from the viewpoint of superiority in hardness and that Nb or Mo be contained from the viewpoint of achieving the best abrasion resistance and oxidation resistance.

In addition, it is preferable that the coating layer consists of 10 or more alternating layers of the first layer represented by $Ti_{a1}Al_{b1}Nb_{d1}M_{e1}(C_{1-x1}N_{x1})$, where $0 \le a1 \le 0.8$, $0 \le b1 \le 0.6$, $0.02 \le d \le 0.4$, $0 \le e1 \le 0.4$, $a1+b1+d1+e1=1$ and $0 \le x1 \le 1$, and the second layer represented by $Ti_{a2}Al_{b2}Nb_{d2}M_{e2}(C_{1-x2}N_{x2})$, where $0 \leq a2 \leq 0.5$, $0.2 \leq b2 \leq 0.8$, $0 \leq d2 \leq 0.25$, $0 \leq e2 \leq 0.7$, $a2+b2+d2+e2=1.0$, $0 \leq x2 \leq 1$ and with the case where $a1=a2$, $b1=b2$ and $d1=d2$ being excluded, because, with this contexture, there is an increase in hardness and a decrease in inner stress of the coating layer, which results in suppressing the chipping and spalling of the coating layer even with an increased thickness of the coating layer.

Here, in the case where M in the second layer is Cr, $a2=0$, $0.3 \leq b2 \leq 0.9$, $d2=0$, $0.1 \leq e2 \leq 0.7$ and $0 \leq x2 \leq 1$, which means the second layer is represented by $Al_{b2}Cr_{e2}(C_{1-x2}N_{x2})$, in particular, there is an increase in the abrasion resistance of the coating layer due to an increase in chipping resistance and welding resistance.

Incidentally, in the case where the coating layer 6 consists of 10 or more alternating layers of the first layer and the second layer as described above (herein after, simply referred to as an alternating layer structure), the entire composition of the coating layer 6 is specified by $Ti_aAl_bNb_dM_e(C_{1-x}N_x)$, where $0 \leq a \leq 0.8$, $0 \leq b \leq 0.6$, $0.02 \leq d \leq 0.4$, $0 \leq e \leq 0.4$, $a+b+d+e=1.0$ and $0 \leq x \leq 1$. Here, the composition of the coating layer 6 can be derived by observing the electron microscope of the cross section of the cutting tool 1, in which the constituent elements of the coating layer 6 are analyzed by using EPMA (electron probe micro analyzer) in the microscopic field in which the entire thickness of the coating layer 6 can be observed.

In addition, C and N, which are non-metal elements contained in the coating layer 6, are effective for achieving hardness and toughness which are desired of a cutting tool, and the preferable range of x (the composition ratio of N) is $0.9 \leq x \leq 1$. Here, according to the present invention, the composition of the coating layer 6 can be observed by using energy dispersive X-ray spectrometry (EDX) or X-ray photoelectron spectroscopy (XPS).

The examples of methods for forming the coating layer 6 which may be applied include a physical vapor deposition (PVD) method such as an ion plating method and sputtering method, and the ideal examples of methods for forming the droplets 7 on the surface of the coating layer 6 includes arc ion plating.

Incidentally, the ideal examples of the substrate 2 include hard metal such as cemented carbide and cermet, which consists of a hard phase mainly containing tungsten carbide and titanium nitride and a binding phase mainly containing iron family metal such as cobalt and nickel, ceramics mainly containing silicon nitride and aluminum oxide and ultrahigh pressure sintered body which is manufactured by sintering a hard phase consisting of polycrystalline diamond and cubic boron nitride and a binding phase such as ceramics and iron family metal under ultrahigh pressure.

(A Method for Manufacturing)

The method for manufacturing cutting tool according to the present embodiment will be described hereafter.

Firstly, a substrate having a shape of a tool is made by using a conventionally well-known method. Secondly, a coating layer is formed on the substrate. The ideal examples of methods for forming a coating layer include a physical vapor deposition (PVD) method such as an ion plating method and a sputtering method. An example of a method for forming a coating layer will be described in detail hereafter. In the case where a coating layer is formed by using an ion plating method, metal targets individually containing metal titanium (Ti), metal aluminum (Al), metal niobium (Nb) and specified metal M, where M is one or more elements selected from among Si, W, Mo, Ta, Hf, Cr, Zr and Y, alloy targets and sintered targets containing the combination of these kinds of metal are set on the position of the side wall of a chamber.

Here, according to the present invention, a main target is set on the side wall of the chamber, a sub target 1, the Nb content of which is larger in comparison to the content of other kinds of metal, is set on the side wall of the chamber and a sub target 2, which has a larger content of the metal other than Nb, is set on the top surface of the chamber, and then a coating layer is formed by sending an arc current through the individual targets. As a result, the compositions of the formed coating layer and droplets according to the present embodiment can be achieved. Incidentally, in the case where sintered targets which are made by sintering a mixture of metal powders are used, the amount of droplets, which precipitate on the surface of the coating layer, tends to become larger than that in the case where alloy targets which are made by melting metal elements and by solidifying them again.

A coating layer and droplets are formed by using an ion plating method or a sputtering method, in which metal sources of the targets described above are vaporized by using arc discharge or glow discharge and made react with nitrogen gas ($N_2$), which is a source of nitrogen, and methane gas ($CH_4$)/acetylene ($C_2H_2$) gas, which are sources of carbon. Here, the substrate is set so that the flank face is nearly parallel to the side wall of the chamber and the rake face is nearly parallel to the top surface of the chamber. Then, a current of 100 A or more and 200 A or less is sent through the main target, a current of 120 A or more and 250 A or less is sent through the sub target, which is placed on the side wall of the chamber and has a large content of Nb, and a current of 80 A or more and 200 A or less is sent as needed through the sub target 2, which is placed on the top of the chamber.

Then, by applying a magnetic field to the generated arc plasma by using such a kind of method in which a magnet is placed in a direction at a right angle to the direction of the targets, the existing conditions of the vaporized metal elements in the plasma are controlled, and, consequently, a large amount of fine droplets are formed. Incidentally, when the coating layer is formed as described above by using an ion plating method or a sputtering method, it is preferable that a bias voltage of 35 V or more and 200 V or less be applied in order to form a high-hardness coating layer in consideration of the crystalline structure of the coating layer and in order to increase the adhesion of the coating layer to the substrate.

In addition, in order to form a coating layer of an alternating layer structure, a main target 1 and a main target 2 are placed at the positions opposite to each other on the side wall of a chamber. Then, a sub target 1 is placed on the side wall of the camber, a sub target 2 is placed on the top surface of the camber, and then the coating layer is formed in the similar way as described above. Here, the compositions of the first layer and the second layer can be adjusted by placing the sub target 1 and the sub target 2 closer to either of the main target 1 or the main target 2.

EXAMPLE 1

Powder of tungsten carbide (WC) having an average particle diameter of 0.8 μm was used as a main element, and 10 mass % of powder of metal cobalt (Co) having an average particle diameter of 1.2 μm, 0.1 mass % of powder of vanadium carbide (VC) having an average particle diameter of 1.0 μm and 0.3 mass % of powder of chromium carbide ($Cr_3C_2$) having an average particle diameter of 1.0 μm were added and mixed and then formed into a shape of a throw away tip of a DCGT11T302MFCQ type by using press forming, thereafter debinding was performed, and then cemented carbide was produced by firing the obtained tip in a vacuum of 0.01 Pa at a temperature of 1450° C. for a time of 1 hour. In addition, the rake face of each sample was polished by using a method such as blasting and brushing. Moreover, the obtained cemented carbide underwent a cutting edge treatment (honing).

Coating layers having the compositions given in Table 1 were formed by applying bias voltages given in Table 1 to the substrates obtained as described above, by sending specified currents through a main target (a target of sintered body), a sub targets 1 (a metal or alloy target) placed on the side wall and a sub target 2 (a target of sintered body) placed on the top surface, and by treating at a temperature for forming a film of 550° C. with a magnetic field being applied through permanent magnets of ring type which were placed at the top and the bottom of a chamber so that the chamber was inserted through the rings.

to the total number of droplets in one microscopic field and the ratio of the number of the coarser droplets having particle diameters of 1000 nm or more to the total number of droplets in one microscopic field were observed. Here, particle diameters of the droplets were calculated by using an image analysis method. In addition, the average compositions of the coating layer and droplets on the rake face and the flank face were derived by calculating the average values of ten values each observed by using energy dispersive X-ray spectrometry (EDS) (EDAX manufactured by AMETEK Co., Ltd). In the Table, the average contents (atom %) of Nb, Al and Ti of the coarser droplets formed on the rake face are respectively denoted by $Nb_{DR}$, $Al_{DR}$ and $Ti_{DR}$, and the average contents (atom %) of Nb, Al and Ti of the coarser droplets formed on the flank face are respectively denoted by $Nb_{DF}$, $Al_{DF}$ and $Ti_{DF}$.

Incidentally, the ratio of a non-metal content was derived by analyzing the constituent elements of the surface of the coating layer by using XPS (X-ray photoelectron spectroscopy), and the ratios of a metal content to a non-metal content of samples No. 1 through 8 were all 1.2 or more and the ratio of a metal content to a non-metal content of sample No. 9 was

TABLE 1

| Sample No. | Main Target Composition | Main Target Current (A) | Sub Target 1 (Side Wall) Composition | Sub Target 1 (Side Wall) Current (A) | Sub Target 2 (Top Surface) Composition | Sub Target 2 (Top Surface) Current (A) | Forming Condition Bias Voltage (V) | Forming Condition Applied Magnetic Field (G) | Coating Layer Composition |
|---|---|---|---|---|---|---|---|---|---|
| 1 | TiAlWNbSi | 130 | AlNb | 150 | TiW | 120 | 50 | 120 | $Ti_{0.42}Al_{0.45}Nb_{0.10}W_{0.02}Si_{0.01}N$ |
| 2 | TiAlW | 110 | AlNb | 120 | Ti | 100 | 35 | 100 | $Ti_{0.40}Al_{0.39}Nb_{0.17}W_{0.04}N$ |
| 3 | TiNb | 160 | Nb | 200 | Ti | 200 | 120 | 95 | $Ti_{0.80}Nb_{0.20}N$ |
| 4 | TiAlNbCr | 200 | AlCrNb | 250 | Ti | 160 | 100 | 135 | $Ti_{0.42}Al_{0.51}Nb_{0.05}Cr_{0.02}N$ |
| 5 | TiAlNbY | 120 | Nb | 180 | Al | 120 | 70 | 160 | $Ti_{0.43}Al_{0.55}Nb_{0.01}Y_{0.01}N$ |
| 6 | TiAlNbCr | 100 | TiNb | 140 | AlSi | 90 | 60 | 120 | $Ti_{0.49}Al_{0.45}Nb_{0.04}Si_{0.02}N$ |
| 7 | TiAlNb | 120 | TiNb | 150 | Al | 80 | 140 | 80 | $Ti_{0.37}Al_{0.53}Nb_{0.10}C_{0.2}N_{0.8}$ |
| 8 | TiAlWSiNb | 130 | Nb | 150 | — | | 75 | — | $Ti_{0.31}Al_{0.50}Nb_{0.09}W_{0.07}Si_{0.03}N$ |
| 9 | TiAlNbSi | 150 | — | | Al | 150 | 100 | 150 | $Ti_{0.41}Al_{0.53}Nb_{0.04}Si_{0.02}N$ |

For each sample obtained as described above, the surface of the coating layer at arbitrary three positions on each of the rake face and the flank face and the droplets formed on the rake face and flank face were observed by using a scanning electron microscope (SEM), then the ratio of the number of the finer droplets having particle diameters of 300 nm or less 1.05. Moreover, as the results of the observation of samples No. 1 through 8 by using TEM (transmission electron microscope), the ratio of a metal content to a non-metal content of any of these samples increased along distance inward from the surface of the coarser droplets. These results are given in Table 2.

TABLE 2

| | Rake Face | | | | | Flank Face | | | | |
|---|---|---|---|---|---|---|---|---|---|---|
| Sample No. | Number Ratio of Finer Droplet (%) | Coarser Droplet (Number Ratio (%)) | $Nb_{DR}$ | $Al_{DR}$ | $Ti_{DR}$ | Number Ratio of Finer Droplet (%) | Coarser Droplet (Number Ratio (%)) | $Nb_{DF}$ | $Al_{DF}$ | $Ti_{DF}$ |
| 1 | 16.2 | 7.5 | 4.8 | 45.5 | 43.3 | 23.0 | 5.4 | 5.3 | 46.7 | 40.0 |
| 2 | 11.5 | 5.7 | 25.1 | 38.6 | 40.0 | 34.1 | 7.3 | 25.6 | 38.6 | 34.8 |
| 3 | 22.1 | 8.5 | 22.4 | — | 88.0 | 32.4 | 5.4 | 28.7 | — | 92.6 |
| 4 | 18.8 | 7.3 | 5.9 | 51.0 | 40.7 | 25.2 | 7.1 | 6.3 | 53.7 | 37.0 |
| 5 | 12.4 | 11.5 | 4.8 | 53.4 | 40.9 | 18.5 | 9.6 | 5.1 | 56.8 | 39.7 |
| 6 | 31.5 | 5.1 | 7.6 | 51.9 | 49.5 | 42.1 | 8.6 | 8.6 | 52.5 | 46.7 |
| 7 | 14.6 | 8.9 | 14.0 | 53.0 | 35.5 | 21.3 | 11.6 | 16.5 | 57.0 | 31.7 |
| 8 | 31.7 | 12.4 | 11.0 | 51.0 | 32.6 | 23.9 | 16.1 | 12.6 | 52.0 | 33.6 |
| 9 | 18.6 | 21.6 | 4.1 | 52.5 | 41.8 | 34.6 | 14.4 | 3.6 | 50.9 | 39.1 |

Cutting tests were conducted by using throw away tips of external turning tool of DCGT11T302MFCQ type under the cutting conditions described below. The results are given in Table 3.
Cutting method: external cutting process by turning
Workpiece: carbon steel (S45C)
Cutting speed: 120 m/min
Feed per revolution: 0.05 mm/rev
Cutting depth: 1.2 mm
Cutting condition: wet
Estimation method: The machined surface of a workpiece after 500 hundred of workpiece had been machined was observed by using a surface roughness tester (SURFCOM manufactured by TOKYO SEIMITSU CO., LTD.), and an arithmetic average roughness Ra was denoted as a roughness of machined surface. In addition, the number of workpiece machined until the life of a tool was counted and the final abrasion condition was observed.

TABLE 3

| | | | | Cutting Result | | |
|---|---|---|---|---|---|---|
| | | Composition Ratio | | Roughness of Machined | Number of | Condition |
| Sample No. | $Nb_{DR}/Nb_{DF}$ | $Al_{DR}/Al_{DF}$ | $Ti_{DR}/Ti_{DF}$ | Surface (μm) | Workpiece (—) | of Cutting Edge |
| 1 | 0.90 | 0.97 | 1.08 | 0.42 | 2000 | Steady Abrasion |
| 2 | 0.98 | 1.00 | 1.15 | 1.02 | 1360 | Steady Abrasion |
| 3 | 0.78 | — | 0.95 | 1.19 | 1290 | Steady Abrasion |
| 4 | 0.93 | 0.95 | 1.10 | 0.61 | 1890 | Steady Abrasion |
| 5 | 0.95 | 0.94 | 1.03 | 0.77 | 1530 | Steady Abrasion |
| 6 | 0.88 | 0.99 | 1.06 | 0.68 | 1680 | Steady Abrasion |
| 7 | 0.85 | 0.93 | 1.12 | 0.85 | 1440 | Steady Abrasion |
| 8 | 0.87 | 0.98 | 0.97 | 1.35 | 630 | Chipping |
| 9 | 1.14 | 1.03 | 1.07 | 1.54 | 1050 | Large Welding/Abrasion |

As indicated in Table 1 through 3, in the case of sample No. 8 which had larger amount of finer droplets on the rake face than on the flank face, the chipping resistance of the flank face was bad. In addition, in the case of sample No. 9 which had a smaller Nb content in the coarser droplets on the flank face than on the rake face, the roughness of the machined surface of the workpiece was bad and the tool life was short.

In contrast, in any case of samples No. 1 through 8, chipping resistance was good and a smooth machined surface was achieved, which showed good cutting performance.

EXAMPLE 2

The coating layers given in Table 4 were formed in the similar way as Example 1 by using a cutting insert which was used in Example 1 and by placing 3 kinds of target on the side wall and one kind of target on the top surface among 4 kinds of target given in Table 4. Incidentally, sintered targets were used as main targets and one target was placed at a position on the side wall which was opposite to a position at which another target was placed. In addition, alloy targets given in Table 4 were used as a sub target 1 and placed at a position adjacent to the main target 1 and a sub target 2 was placed at a position directly above the main target 1.

TABLE 4

| | Main Target 1 | | Main Target 2 | | Sub Target 1 (Side Wall) | | Sub Target 2 (Top Surface) | | Forming Condition | |
|---|---|---|---|---|---|---|---|---|---|---|
| Sample No. | Composition | Current (A) | Composition | Current (A) | Composition | Current (A) | Composition | Current (A) | Bias Voltage (V) | Applied Magnet Field (G) |
| 10 | TiAlWNbSi | 100 | AlCr | 75 | AlNb | 150 | TiW | 100 | 75 | 100 |
| 11 | TiAlNb | 50 | Ti | 150 | AlNb | 120 | TiAl | 100 | 50 | 100 |
| 12 | TiNb | 150 | TiNbW | 50 | Nb | 150 | Ti | 150 | 100 | 80 |
| 13 | TiAlNbCr | 75 | AlCr | 100 | AlNb | 200 | TiCr | 150 | 50 | 125 |
| 14 | TiAlNbY | 100 | TiAl | 75 | Nb | 125 | Al | 125 | 125 | 150 |

In a similar way as Example 1, for the inserts obtained as described above, the entire composition of the coating layer and the compositions of individual layers (the upper for the first layer and the lower for the second layer in the Table) are given in Table 5. Incidentally, as the result of the observation of the a coating layer by using a transmission electron microscope (TEM), there was a structure of alternating layers of the first layer and the second layer having compositions given in Table 5 with the thickness of each layer being 10 nm or less. The number ratio and the compositions of the finer droplets and the coarser droplets were observed and are given in Tables 6 and 7. Moreover, cutting tests were conducted by using the obtained inserts under the same cutting conditions as Example 1. The results are given in Table 7.

TABLE 5

| | Coating Layer | |
|---|---|---|
| | | Composition of Individual Layer |
| Sample No. | Entire Composition | Upper: First Layer Lower: Second Layer |
| 10 | $Ti_{0.28}Al_{0.54}Nb_{0.07}Cr_{0.09}W_{0.01}Si_{0.01}N$ | $Ti_{0.40}Al_{0.47}Nb_{0.10}W_{0.02}$ $Si_{0.02}NAl_{0.70}Cr_{0.30}N$ |
| 11 | $Ti_{0.64}Al_{0.24}Nb_{0.10}W_{0.02}N$ | $Ti_{0.43}Al_{0.38}Nb_{0.16}W_{0.03}N$ TiN |
| 12 | $Ti_{0.67}Nb_{0.25}W_{0.08}C_{0.2}N_{0.8}$ | $Ti_{0.78}Nb_{0.22}C_{0.2}N_{0.8}Ti_{0.5}$ $Nb_{0.3}W_{0.2}C_{0.2}N_{0.8}$ |
| 13 | $Ti_{0.13}Al_{0.67}Nb_{0.02}Cr_{0.18}N$ | $Ti_{0.43}Al_{0.50}Nb_{0.05}Cr_{0.02}N$ $Al_{0.75}Cr_{0.25}N$ |
| 14 | $Ti_{0.47}Al_{0.51}Nb_{0.01}Y_{0.01}N$ | $Ti_{0.44}Al_{0.54}Nb_{0.02}Y_{0.02}N$ $Ti_{0.50}Al_{0.50}N$ |

TABLE 6

| | Rake Face | | | | | Flank Face | | | | |
|---|---|---|---|---|---|---|---|---|---|---|
| | Number Ratio of Finer | Coarser Droplet | | | | Number Ratio of Finer | Coarser Droplet | | | |
| Sample No. | Droplet (%) | (Number Ratio (%)) | $Nb_{DR}$ | $Al_{DR}$ | $Ti_{DR}$ | Droplet (%) | (Number Ratio (%)) | $Nb_{DF}$ | $Al_{DF}$ | $Ti_{DF}$ |
| 10 | 12.3 | 5.7 | 7.3 | 55.6 | 37.1 | 18.2 | 15.8 | 8.5 | 56.8 | 35.0 |
| 11 | 16.5 | 4.8 | 14.9 | 18.7 | 66.3 | 23.4 | 13.4 | 15.4 | 18.7 | 54.8 |
| 12 | 18.5 | 6.4 | 22.2 | — | 77.8 | 25.5 | 19.7 | 28.1 | — | 81.0 |
| 13 | 9.7 | 6.3 | 3.0 | 67.0 | 30.0 | 12.7 | 3.6 | 3.1 | 70.5 | 26.8 |
| 14 | 5.5 | 10.2 | 1.5 | 49.5 | 49.0 | 8.5 | 1.4 | 1.6 | 53.2 | 47.1 |

TABLE 7

| | Composition Ratio | | | Roughness | Cutting Result | |
|---|---|---|---|---|---|---|
| Sample No. | $Nb_{DR}/Nb_{DF}$ | $Al_{DR}/Al_{DF}$ | $Ti_{DR}/Ti_{DF}$ | of Machined Surface (μm) | Number of Workpiece (−) | Condition of Cutting edge |
| 10 | 0.86 | 0.98 | 1.06 | 0.39 | 2300 | Steady Abrasion |
| 11 | 0.97 | 1.00 | 1.21 | 0.96 | 1390 | Steady Abrasion |
| 12 | 0.79 | — | 0.96 | 1.09 | 1320 | Steady Abrasion |
| 13 | 0.96 | 0.95 | 1.12 | 0.56 | 1910 | Steady Abrasion |
| 14 | 0.94 | 0.93 | 1.04 | 0.71 | 1550 | Steady Abrasion |

As indicated in Tables 4 through 7, in any case of samples No. 10 through 14 in which there were larger amount of finer droplets on the flank face than on the rake face and a Nb content in the average components of the coarser droplets having particle diameters of 1000 nm or more on the flank face was larger than that on the rake face, chipping resistance was good and a smooth machined surface was achieved, which showed good cutting performance.

| Reference Signs List | |
|---|---|
| 1 | cutting tool |
| 2 | substrate |
| 3 | rake face |
| 4 | flank face |
| 5 | cutting edge |
| 6 | coating layer |
| 7 | droplet |
| 7a | finer droplet |
| 7b | coarser droplet |

What is claimed is:

1. A cutting tool comprising:
    a substrate which is coated with a coating layer containing $Ti_aAl_bNb_dM_e(C_{1-x}N_x)$, where M represents one or more elements selected from among Si, W, Mo, Ta, Hf, Cr, Zr and Y, where $0.1 \le a \le 0.7$, $0 \le b \le 0.8$, $0.02 \le d \le 0.25$, $0 \le e \le 25$, $a+b+d+e=1.0$ and $0 \le x \le 1$;
    a rake face;
    a flank face;
    a cutting edge between the rake face and the flank face; and
    droplets on the surface of the coating layer, the droplets comprising:
        finer droplets having particle diameters of 300 nm or less; and
        coarser droplets having particle diameters of 1000 nm or more; wherein
        the flank face comprises a higher percentage of the finer droplets than the rake face; and
        a Nb content in an average composition of the coarser droplets on the flank face is higher than a Nb content in an average composition of the coarser droplets on the rake face.

2. The cutting tool according to claim 1, wherein the coarser droplets on the surface of the coating layer on the flank face have a droplet surface where an atomic ratio of a metal content to a non-metal content is greater than 1.2, that ratio increasing with a distance inward from the droplet surface towards a center of the coarser droplets.

3. The cutting tool according to claim 1, wherein the coating layer consists of:
    a plurality of first layers represented by $Ti_{a1}Al_{b1}Nb_{d1}M_{e1}(C_{1-x1}N_{x1})$, where $0 \le a1 \le 0.8$, $0 \le b1 \le 0.6$, $0.02 \le d1 \le 0.4$, $0 \le e1 \le 0.4$, $a1+b1+d1+e1=1$ and $0 \le x1 \le 1$, and
    a plurality of second layers represented by $Ti_{a2}Al_{b2}Nb_{d2}M_{e2}(C_{1-x2}N_{x2})$, where $0 \le a2 \le 0.5$, $0.2 \le b2 \le 0.8$, $0 \le d2 \le 0.25$, $0 \le e2 \le 0.7$, $a2+b2+d2+e2=1.0$, $0 \le x2 \le 1$, excluding $a1=a2$, $b1=b2$, $d1=d2$ and $e1=e2$; wherein
    the first layers and second layers are laminated in an alternating fashion and the total number of first and second layers is at least 10.

4. The cutting tool according to claim 3, wherein M in the second layer is Cr, the relationships $a2=0$, $0.3 \le b2 \le 0.9$, $d2=0$, $0.1 \le e2 \le 0.7$ and $0 \le x2 \le 1$ are satisfied and the second layer is represented by $Al_{b2}Cr_{e2}(C_{1-x2}N_{x2})$.

* * * * *

UNITED STATES PATENT AND TRADEMARK OFFICE
CERTIFICATE OF CORRECTION

PATENT NO. : 8,691,366 B2
APPLICATION NO. : 13/700408
DATED : April 8, 2014
INVENTOR(S) : Masahiro Waki and Yaocan Zhu It is certified that error appears in the above-identified patent and that said Letters Patent is hereby corrected as shown below:

On the Title Page:

Item (57) in the Abstract, line 5 reads:

$0 \leq e \leq 25$, a+b+d+e= 1.0 and $0 \leq x \leq 1$ and is provided with a rake and should read:

$0 \leq e \leq 0.25$, a+b+d+e= 1.0 and $0 \leq x \leq 1$ and is provided with a rake In the Specification:

Column 4, line 66 reads:

$0.02 \leq d \leq 0.4$, $0 \leq e1 \leq 0.4$, a1+b1+d1+e1=1 and $0 \leq x1 \leq 1$, and the and should read:

$0.02 \leq d1 \leq 0.4$, $0 \leq e1 \leq 0.4$, a1+b1+d1+e1=1 and $0 \leq x1 \leq 1$, and the Corrections to Table 1 are shown in ATTACHMENT A

Corrections to Table 2 are shown in ATTACHMENT B

Corrections to Table 4 are shown in ATTACHMENT C

Corrections to Table 3 are shown in ATTACHMENT D

Corrections to Table 6 are shown in ATTACHMENT E

Signed and Sealed this
Twenty-ninth Day of July, 2014

Michelle K. Lee
*Deputy Director of the United States Patent and Trademark Office*

Corrections to Table 7 are shown in ATTACHMENT F

In the Claims:

Column 12 line 18 reads:

$0 \leq e \leq 25$, $a+b+d+e=1.0$ and $0 \leq x \leq 1$ and should read:

$0 \leq e \leq 0.25$, $a+b+d+e=1.0$ and $0 \leq x \leq 1$

CERTIFICATE OF CORRECTION (continued)
U.S. Pat. No. 8,691,366 B2

ATTACHMENT A

Column 7 and 8 (Table 1) reads:      and should read:

| Sample No. | Main target | | Sub Target 1 (Side Wall) | | Sub Target 2 (Top Surface) | | Forming conditions | | Coating Layer Composition |
|---|---|---|---|---|---|---|---|---|---|
| | Composition | Current (A) | Composition | Current (A) | Composition | Current (A) | Bias Applied Voltage (V) | Magnetic Field (G) | |

| Sample No. | Main target | | Sub Target 1 (Side Wall) | | Sub Target 2 (Top Surface) | | Forming conditions | | Coating Layer Composition |
|---|---|---|---|---|---|---|---|---|---|
| | Composition | Current (A) | Composition | Current (A) | Composition | Current (A) | Bias Voltage (V) | Applied Magnetic Field (G) | |

CERTIFICATE OF CORRECTION (continued)  Page 4 of 8
U.S. Pat. No. 8,691,366 B2

ATTACHMENT B

Column 7 and 8 (Table 2) reads:    and should read:

| Sample No. | Rake Face | | | | | | Flank Face | | | | | |
|---|---|---|---|---|---|---|---|---|---|---|---|---|
| | Number Ratio of Finer Droplet (%) | Coarser Droplet | | | | | Number Ratio of Finer Droplet (%) | Coarser Droplet | | | | |
| | | (Number Ratio (%)) | $Nb_{DR}$ | $Al_{DR}$ | $Ti_{DR}$ | | | (Number Ratio (%)) | $Nb_{DF}$ | $Al_{DF}$ | $Ti_{DF}$ |

| Sample No. | Flank Face | | | | | | Rake Face | | | | | |
|---|---|---|---|---|---|---|---|---|---|---|---|---|
| | Number Ratio of Finer Droplet (%) | Coarser Droplet | | | | | Number Ratio of Finer Droplet (%) | Coarser Droplet | | | | |
| | | (Number Ratio (%)) | $Nb_{DF}$ | $Al_{DF}$ | $Ti_{DF}$ | | | (Number Ratio (%)) | $Nb_{DR}$ | $Al_{DR}$ | $Ti_{DR}$ |

CERTIFICATE OF CORRECTION (continued)
U.S. Pat. No. 8,691,366 B2

ATTACHMENT C

Column 9 and 10 (Table 4) reads:   and should read:

| Sample No. | Main Target 1 | | Main Target 2 | | Sub Target 1 (Side Wall) | | Sub Target 2 (Top Surface) | | Forming Condition | |
|---|---|---|---|---|---|---|---|---|---|---|
| | Composition | Current (A) | Composition | Current (A) | Composition | Current (A) | Composition | Current (A) | Bias Voltage (V) | Applied Magnet Field (G) |

| Sample No. | Main Target 1 | | Main Target 2 | | Sub Target 1 (Side Wall) | | Sub Target 2 (Top Surface) | | Forming Condition | |
|---|---|---|---|---|---|---|---|---|---|---|
| | Composition | Current (A) | Composition | Current (A) | Composition | Current (A) | Composition | Current (A) | Bias Voltage (V) | Applied Magnet Field (G) |

ATTACHMENT D

CERTIFICATE OF CORRECTION (continued)
U.S. Pat. No. 8,691,366 B2

Column 9 (Table 3) reads:        and should read:

| Sample No. | Composition Ratio | | | | Roughness of Machined Surface (μm) | Cutting Result | |
|---|---|---|---|---|---|---|---|
| | $Nb_{DR}/Nb_{DF}$ | $Al_{DR}/Al_{DF}$ | $Ti_{DR}/Ti_{DF}$ | | | Number of Workpiece (-) | Condition of Cutting Edge |

| Sample No. | Composition Ratio | | | Roughness of Machined Surface (μm) | Cutting Result | |
|---|---|---|---|---|---|---|
| | $Nb_{DR}/Nb_{DF}$ | $Al_{DR}/Al_{DF}$ | $Ti_{DR}/Ti_{DF}$ | | Number of Workpiece (-) | Condition of Cutting Edge |

ATTACHMENT E

CERTIFICATE OF CORRECTION (continued)
U.S. Pat. No. 8,691,366 B2

Column 11 and 12 (Table 6) reads: and should read:

| Sample No. | Rake Face | | | | | Flank Face | | | | |
|---|---|---|---|---|---|---|---|---|---|---|
| | Number Ratio of Finer Droplet (%) | Coarser Droplet (Number Ratio (%)) | | | | Number Ratio of Finer Droplet (%) | Coarser Droplet (Number Ratio (%)) | | | |
| | | | $Nb_{DR}$ | $Al_{DR}$ | $Ti_{DR}$ | | | $Nb_{DF}$ | $Al_{DF}$ | $Ti_{DF}$ |

ATTACHMENT F

Column 11 (Table 7) reads:                    and should read: